(12) United States Patent
Narushima et al.

(10) Patent No.: US 8,852,340 B2
(45) Date of Patent: Oct. 7, 2014

(54) METHOD FOR MANUFACTURING SINGLE CRYSTAL

(71) Applicant: Sumco Techxiv Corporation, Omura (JP)

(72) Inventors: Yasuhito Narushima, Omura (JP); Fukuo Ogawa, Omura (JP); Shinichi Kawazoe, Omura (JP); Toshimichi Kubota, Omura (JP)

(73) Assignee: Sumco Techxiv Corporation, Omura-shi ( * ) Notice: Subject to any disclaimer, the term of this patent is extended or adjusted under 35 U.S.C. 154(b) by 0 days.

(21) Appl. No.: 14/046,493

(22) Filed: Oct. 4, 2013

(65) Prior Publication Data

US 2014/0033967 A1 Feb. 6, 2014

Related U.S. Application Data

(62) Division of application No. 12/515,725, filed as application No. PCT/JP2008/058482 on May 7, 2008, now Pat. No. 8,580,032.

(30) Foreign Application Priority Data

May 10, 2007 (JP) .................. 2007-125847

(51) Int. Cl.
| | |
|---|---|
| *C30B 11/00* | (2006.01) |
| *C30B 15/00* | (2006.01) |
| *C30B 21/06* | (2006.01) |
| *C30B 27/02* | (2006.01) |
| *C30B 28/10* | (2006.01) |
| *C30B 30/04* | (2006.01) |
| *C30B 9/00* | (2006.01) |
| *C30B 17/00* | (2006.01) |
| *C30B 21/02* | (2006.01) |
| *C30B 28/06* | (2006.01) |
| *C30B 15/20* | (2006.01) |
| *C30B 15/04* | (2006.01) |
| *C30B 29/06* | (2006.01) |

(52) U.S. Cl.
CPC ............. *C30B 15/20* (2013.01); *C30B 15/04* (2013.01); *C30B 29/06* (2013.01)
USPC .............. 117/13; 117/11; 117/19; 117/74

(58) Field of Classification Search
USPC ........................... 117/11, 13, 19, 74
See application file for complete search history.

(56) References Cited

U.S. PATENT DOCUMENTS

| | | | | |
|---|---|---|---|---|
| 5,429,067 | A * | 7/1995 | Tatsumi et al. | 117/13 |
| 5,477,805 | A * | 12/1995 | Izunome et al. | 117/13 |
| 5,524,574 | A * | 6/1996 | Huang et al. | 117/20 |
| 5,904,768 | A * | 5/1999 | Holder | 117/20 |
| 8,580,032 | B2 * | 11/2013 | Narushima et al. | 117/74 |
| 2008/0078322 | A1 * | 4/2008 | Kawazoe et al. | 117/217 |

FOREIGN PATENT DOCUMENTS

| | | |
|---|---|---|
| JP | 03-159986 A | 7/1991 |
| JP | 05-70279 A | 3/1993 |
| JP | 07-232994 A | 9/1995 |
| JP | 09-227275 A | 9/1997 |
| JP | 10-182289 A | 7/1998 |
| JP | 2000-233994 A | 8/2000 |
| JP | 2004-149411 A | 5/2004 |
| WO | WO 01/63027 A1 | 8/2001 |

OTHER PUBLICATIONS

Xinming Huang, et al., "Effect of Background Gas Pressure on Evaporation of Oxides from Sb-Doped Si Melt", Jpn. J. Appl. Phys. vol. 33 (1994), pp. L902-L904 (in English).
English language International Search Report dated Aug. 12, 2008 issued in International Application No. PCT/JP2008/058482.
Related U.S. Appl. No. 12/515,730, First Named Inventor: Yasuhito Narushima, Title: "Method for Manufacturing Single Crystal", filed May 20, 2009, now USP 8,110,042.
English language International Preliminary Report of Patentability dated Nov. 24, 2009 issued in International Application No. PCT/JP2008/058482.

* cited by examiner

Primary Examiner — James McDonough
(74) Attorney, Agent, or Firm — Holtz Holtz Goodman & Chick PC

(57) ABSTRACT

In consideration of influence of segregation, an evaporation area of a volatile dopant and influence of pulling-up speed at the time of manufacturing a monocrystal using a monocrystal pulling-up device, an evaporation speed formula for calculating evaporation speed of the dopant is derived. At predetermined timing during pulling-up, gas flow volume and inner pressure in a chamber are controlled such that a cumulative evaporation amount of the dopant, calculated based on the evaporation speed formula, becomes a predetermined amount. A difference between a resistivity profile of the monocrystal predicted based on the evaporation speed formula and an actual resistivity profile is made small. Since no volatile dopant is subsequently added, increase in workload on an operator, increase of manufacturing time, an increase in amorphous adhering to the inside of the chamber, and an increase in workload at the time of cleaning the inside of the chamber can be prevented.

5 Claims, 11 Drawing Sheets

METHOD FOR MANUFACTURING SINGLE CRYSTAL

TECHNICAL FIELD

The present invention relates to a method of manufacturing a monocrystal.

BACKGROUND ART

According to a known traditional method, a monocrystal is manufactured by so-called CZ (Czochralski) method by use of a dopant-added melt prepared by adding volatile dopant to a semiconductor melt (for instance, see a patent document 1). According to the CZ method, a monocrystal is manufactured by, under conditions where temperature, atmosphere and pulling-up conditions are controlled, pulling up seed crystal from a dopant-added melt in a crucible while rotating the seed crystal and by solidifying the seed crystal.

According to the patent document 1, volatile dopant is added to a melt in order for the monocrystal to have a target resistivity, and the volatile dopant is doped to the melt by conducting a subsequent doping at least one time after elapse of time (t) in order to compensate a loss of the volatile dopant due to evaporation of the volatile dopant from the melt.

In addition, a method usable for predicting resistivity profile of the monocrystal manufactured in the above manner has been also known.

According to the method usable for predicting resistivity profile of the monocrystal, the resistivity profile of the monocrystal is predicted based on a dopant concentration (Cs) calculated from the following formula (1) (formula of Sceil), in which: (Cs) represents the concentration of dopant in the monocrystal; (ko) represents a segregation coefficient; (Co) represents an initial concentration of the dopant in the semiconductor melt; and (I) represents a solidification rate.

$$Cs = ko \times Co \times (1-I)^{(ko-1)} \quad (1)$$

Patent Document 1: JP-A-2004-149411

DISCLOSURE OF THE INVENTION

Problems to be Solved by the Invention

However, an exemplary problem(s) of the arrangement of the patent document 1 is that, since the volatile dopant is doped thereto by the subsequent doping discretely from the initial doping, an operator may be burdened with increased workload or that longer time may be required for manufacturing a monocrystal. In addition, the subsequent doping may increase amorphous adherent to the inside of the chamber due to evaporation of the volatile dopant. If the amorphous drops into the melt during manufacturing of a monocrystal, monocrystallization of crystal may be hampered. Alternatively, if the amorphous is firmly adherent thereto, increased load may be required for cleaning the inside of the chamber.

When the method for predicting the resistivity profile based on the above-described formula (1) is applied to an arrangement where the volatile dopant is added to the semiconductor melt, the volatile dopant may be evaporated by the time when manufacturing of a monocrystal is started. Thus, the concentration (Co) in the formula (1) may not be constant. Accordingly, resistivity profile of a monocrystal predicted based on the formula (1) may differ greatly from the actual resistivity profile thereof.

An object of the invention is to provide a method of manufacturing a monocrystal by which monocrystal having desirable resistivity can be manufactured without reducing process capability.

Means for Solving the Problems

A method of manufacturing a monocrystal according to an aspect of the invention includes:

providing a monocrystal pulling-up apparatus including: a chamber; a crucible disposed within the chamber and adapted to accommodate a dopant-added melt prepared by adding a volatile dopant to a semiconductor melt; and a pulling-up portion for pulling up a seed crystal after the seed crystal is brought into contact with the dopant-added melt;

using a formula (2) as follows, in which: J represents an evaporation speed of the volatile dopant at which the volatile dopant is evaporated from the dopant-added melt; N represents a concentration of the volatile dopant contained in the dopant-added melt; X represents a flow volume of inactive gas introduced into the chamber; Y represents a pressure in the chamber; and $\alpha$ and $\beta$ each represent a coefficient; and controlling at least either one of the flow volume X and the pressure Y so that a cumulative evaporation amount at a predetermined timing of pulling-up becomes a predetermined amount, the cumulative evaporation amount being calculated based on the formula (2).

$$J = \alpha \sqrt{X} e^{(\beta N/\sqrt{Y})} \quad (2)$$

According to the aspect of the invention, when a monocrystal is manufactured by use of the dopant-added melt prepared by adding a volatile dopant to a semiconductor melt, at least either one of the flow volume X of inactive gas introduced into the chamber (hereinafter referred to as gas flow volume) and the pressure Y within the chamber (hereinafter referred to as inner pressure) is controlled at the predetermined timing so that the cumulative amount of the evaporation speed J of the volatile dopant (hereinafter referred to as dopant-evaporation speed), which is calculated from the above formula (2), becomes the predetermined amount. The predetermined timing at which at least either one of the gas flow volume X and the inner pressure Y is controlled means a timing at which a control over the evaporation speed J is initiated so as to make the dopant-added melt capable of providing the monocrystal with a desirable value of resistivity. In addition, the predetermined amount to which the cumulative amount of the evaporation speed J of the volatile dopant is set means an amount of the volatile dopant evaporated from the dopant-added melt so that the resistivity can become the desirable value.

As a consequence of concentrated studies, the inventor(s) have derived the above formula (2) (hereinafter referred to as evaporation speed formula (2)) in the following manner as an evaporation speed formula for calculating the dopant-evaporation speed J (atoms/sec$^{-1}$·cm$^{-2}$).

Specifically, factors dependant on the evaporation speed formula are empirically known to be the following three factors: concentration N (atoms/cm$^{-3}$) of the volatile dopant contained in the dopant-added melt (hereinafter referred to as in-melt dopant concentration); the gas flow volume X; and the inner pressure Y.

Then, a monocrystal was manufactured under conditions where: the gas flow volume X was set at 150 L/min; and the inner pressure Y was set at 59985 Pa. An outer circumference of the monocrystal was ground, so that resistivity that its lateral face exhibited in the crystal axis direction (hereinafter referred to as skin ρ) was measured. Subsequently, a difference between resistivity after a unit time Δt elapsed from a predetermined reference point according to a theoretical segregation and an actual skin ρ was obtained.

FIG. 1 shows a relationship of an in-melt dopant concentration calculated based on the theoretical segregation, an in-melt dopant concentration based on the actual skin ρ and the evaporation speed of the volatile dopant.

Since the in-melt dopant concentration calculated based on the theoretical segregation can be derived from the above formula (1) in a conversion manner, the difference between the in-melt dopant concentration calculated based on the theoretical segregation and the in-melt dopant concentration based on the actual values of skin ρ corresponds to an amount of the volatile dopant having been evaporated during the unit time Δt.

Further, with the unit time Δt being set at 1 second, a remaining amount of the dopant-added melt was calculated based on the solidification rate of the monocrystal for each time period. Then, the evaporation amount of the volatile dopant was corrected based on a surface area of the dopant-added melt, i.e., an evaporation area of the volatile dopant. The corrected evaporation amount corresponds to an evaporation amount per unit time (1 sec) and unit area (1 cm$^2$), i.e., the evaporation speed of the volatile dopant.

FIG. 2 shows a relationship between the in-melt dopant concentration and the evaporation speed after the correction.

Subsequently, dependency of the gas flow volume X and the inner pressure Y on the evaporation speed formula was examined. Specifically, as shown in the following Table 1, monocrystals of levels 1 to 5 were manufactured with the inner pressure Y being set at a constant value.

TABLE 1

| Level | 1 | 2 | 3 | 4 | 5 |
|---|---|---|---|---|---|
| Gas Flow volume X (L/min) | 50 | 80 | 100 | 150 | 200 |
| Inner pressure Y (Pa) | 59985 | 59985 | 59985 | 59985 | 59985 |

On the other hand, as shown in the following Table 2, monocrystals of levels 6 to 9 were manufactured with the gas flow volume X being set at a constant value.

TABLE 2

| Level | 6 | 7 | 8 | 9 |
|---|---|---|---|---|
| Gas Flow volume X (L/min) | 50 | 50 | 50 | 50 |
| Inner pressure Y (Pa) | 9997 | 25060 | 59985 | 79980 |

Relative to a profile of the skin ρ obtained from the monocrystals of the levels 1 to 9, a variety of coefficients were tried so as to find a suitable formula. Then, the above evaporation speed formula (2) was derived.

In other words, in consideration of influence of segregation, a shape of the crucible corresponding to the evaporation area of the volatile dopant and influence of pulling-up speed of a crystal, the evaporation speed formula (2) was derived.

By assigning to the coefficient(s) α and β a value specific to a monocrystal pulling-up apparatus (e.g., a value corresponding to an inner shape of the chamber or a positional relationship of components within the chamber, a value corresponding to whether or not a rectifier member shaped like a cylinder or like an inverted truncated cone having openings at both vertical ends is placed above the semiconductor melt, a value corresponding to a shape of a flow channel for inactive gas, or the like), the evaporation speed formula (2) may be applied to any monocrystal pulling-up apparatus.

Accordingly, by controlling the gas flow volume X and/or the inner pressure Y so that the cumulative amount of the dopant evaporation speed J calculated from the evaporation speed formula (2) becomes the predetermined amount, the evaporation speed J of the volatile dopant may be increased or decreased from a predetermined speed. Thus, resistivity of the monocrystal, which is substantially inversely proportional to the in-melt dopant concentration, may be controlled to be a desirable value while influence of segregation, a shape of a crucible and influence of pulling-up speed are taken into consideration. Therefore, a difference between resistivity of the monocrystal predicted based on the evaporation speed formula (2) and the actual resistivity can be made smaller as compared to a traditional arrangement.

In addition, since no volatile dopant is subsequently added in order to compensate a loss of the volatile dopant due to evaporation, an increase in workload on an operator and elongation of the manufacturing time can be prevented. Further, an increase in amorphous adhering to the inside of the chamber due to the evaporation of the volatile dopant, a hamper in mono-crystallization of crystal and an increase in load at the time of cleaning the inside of the chamber can also be prevented.

Therefore, a monocrystal having desirable resistivity can be manufactured without reducing process capability.

Preferably in the aspect of the invention, when an initiation standby period is longer than a reference period, at least either one of the flow volume X and the pressure Y is controlled to reduce the evaporation speed so that the cumulative evaporation amount becomes a reference amount, the initiation standby period running from when an addition of the volatile dopant to the semiconductor melt is terminated to when pulling-up is initiated. The reference period herein means a period that runs from when addition of the volatile dopant is terminated to when pulling-up is initiated in a typical manufacturing. In addition, the reference amount herein means an cumulative evaporation amount of the volatile dopant evaporated from the dopant-added melt in a typical manufacturing.

According to the aspect of the invention, when the initiation standby period is longer than the reference period (hereinafter referred to as long standby state), at least either one of the gas flow volume X and the inner pressure Y is controlled so that the cumulative evaporation amount of the dopant becomes the reference amount (i.e., so as to reduce the evaporation of the volatile dopant).

In the long standby state, the cumulative evaporation amount of the dopant up to the initiation of pulling-up is larger than the reference amount when the initiation standby period is within the range of the reference period (hereinafter referred to as reference standby state). When, in this long standby state, a monocrystal is manufactured with the gas flow volume X and the inner pressure Y each being set at the same value as in the reference standby state (i.e., when a monocrystal is manufactured with the dopant-evaporation speed being set at the same value as in the reference standby state), the in-melt dopant concentration per predetermined time becomes lower than that in the reference standby state. Accordingly, the monocrystal exhibits greater resistivity all over in a pulling-up direction than a monocrystal manufactured in the reference standby state.

Thus, when the cumulative evaporation amount of the dopant up to the initiation of pulling-up is large as a consequence of the long standby state, by performing such a control as to reduce the evaporation of the volatile dopant after the initiation of pulling-up, the in-melt dopant concentration per predetermined time can be gradually approximated to the concentration exhibited in the reference standby state. Therefore, the monocrystal, except for its portion adjacent to the seed crystal (hereinafter referred to as base end portion of the monocrystal), can exhibit resistivity that is substantially equal to that of a monocrystal manufactured in the reference standby state. Accordingly, mass-production of a monocrystal having substantially equal resistivity except for its base end portion can be facilitated.

Preferably in the aspect of the invention, when an initiation standby period is shorter than a reference period, at least either one of the flow volume X and the pressure Y is controlled to increase the evaporation speed so that the cumulative evaporation amount becomes a reference amount, the initiation standby period running from when an addition of the volatile dopant to the semiconductor melt is terminated to when pulling-up is initiated.

According to the aspect of the invention, when the initiation standby period is shorter than the reference period (hereinafter referred to as short standby period), at least either one of the gas flow volume X and the inner pressure Y is controlled so that the cumulative evaporation amount of the dopant becomes the reference amount (i.e., so as to increase the evaporation of the volatile dopant).

When, in the short standby state, a monocrystal is manufactured with the dopant-evaporation speed being set at the same value as in the reference standby state, actions contrary to the above-described long standby state are exerted, so that the thus-manufactured monocrystal exhibits smaller resistivity all over in the pulling-up direction than a monocrystal manufactured in the reference standby state.

Thus, when the cumulative evaporation amount of the dopant up to the initiation of pulling-up is small as a consequence of the short standby state, by performing such a control as to increase the evaporation of the volatile dopant after the initiation of pulling-up, the in-melt dopant concentration per predetermined time can be gradually approximated to the concentration exhibited in the reference standby state. Therefore, the monocrystal, except for its base end portion, can exhibit the resistivity that is substantially equal to that of a monocrystal manufactured in the reference standby state. Accordingly, mass-production of a monocrystal having substantially equal resistivity except for its base end portion can be facilitated.

Preferably in the aspect of the invention, at least either one of the flow volume X and the pressure Y is controlled substantially consecutively during pulling-up so as to manufacture the monocrystal.

According to the aspect of the invention, for manufacturing of a monocrystal, at least either one of the gas flow volume X and the inner pressure Y is controlled substantially consecutively during pulling-up.

Thus, a monocrystal having a desirable resistivity profile all over in its longitudinal direction can be manufactured, thereby contributing to an increased yield rate as compared to a traditional arrangement.

Preferably in the aspect of the invention, resistivity of the monocrystal is controlled by controlling the cumulative evaporation amount to become the predetermined amount.

According to the aspect of the invention, by changing the dopant-evaporation speed J so as to control the cumulative evaporation amount of the dopant, resistivity of the monocrystal is controlled.

Accordingly, by adopting a simple method that only requires the dopant-evaporation speed J to be controlled, a monocrystal having a desirable resistivity profile can be easily manufactured.

BEST MODE FOR CARRYING OUT THE INVENTION

Exemplary embodiment(s) of the invention will be described with reference to the attached drawings.

Figure 1:
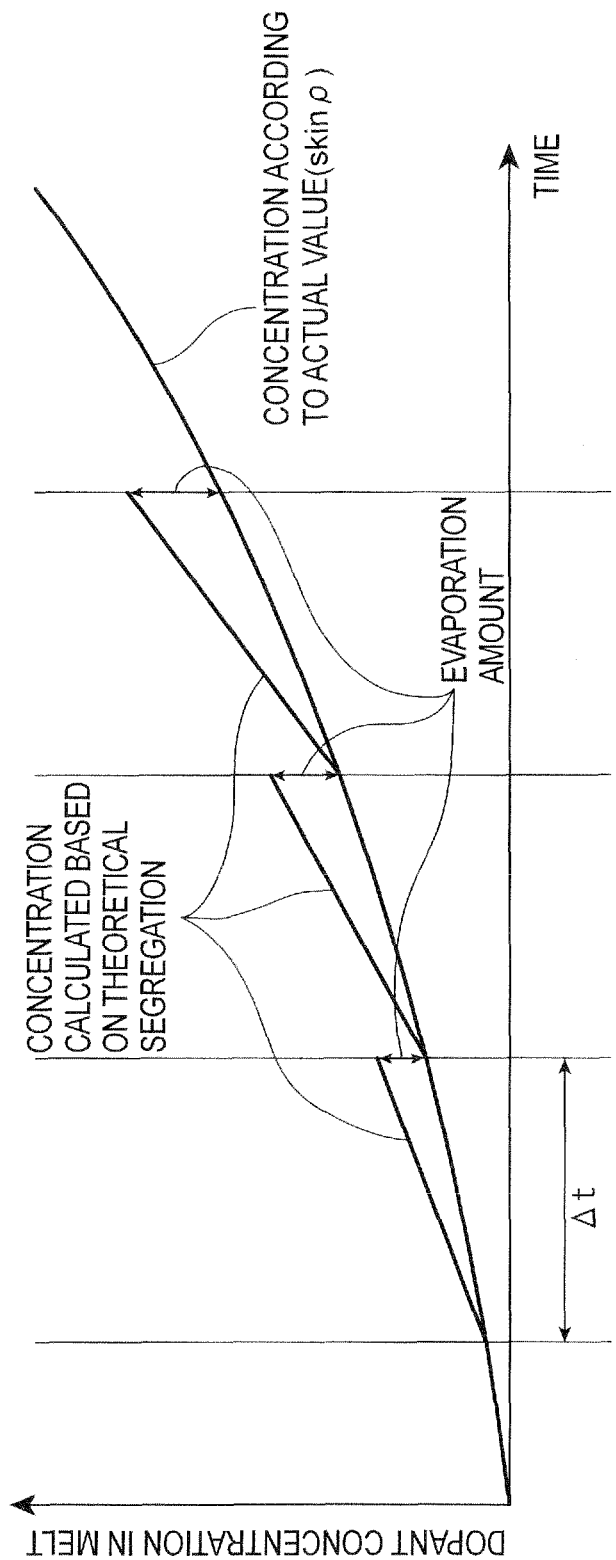
FIG. 1 is a graph showing a relationship of an in-melt dopant concentration calculated based on a theoretical segregation, an in-melt dopant concentration according to the actual skin ρ and an evaporation speed of the volatile dopant, all of which are based on an experiment conducted for deriving an evaporation speed formula according to an aspect of the invention.
Figure 2:
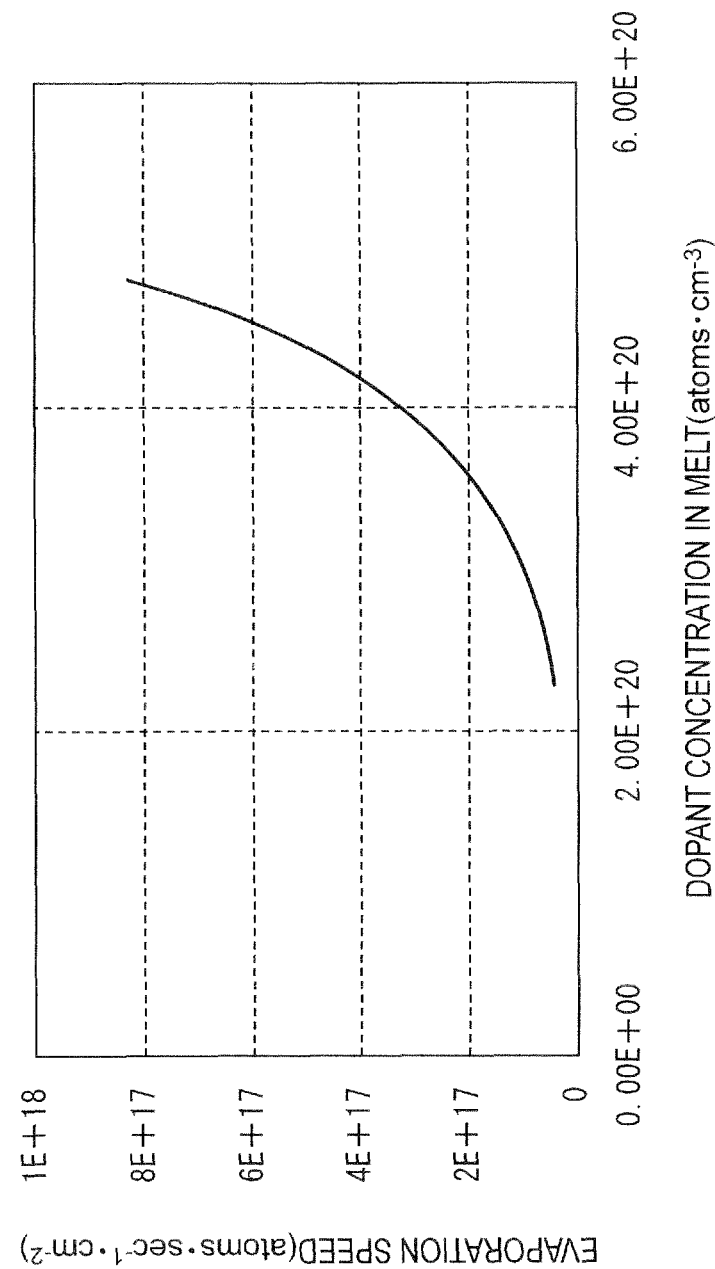
FIG. 2 is a graph showing the in-melt dopant concentration and the evaporation speed after correction, both of which are based on the experiment conducted for deriving the evaporation speed formula.
Figure 3:
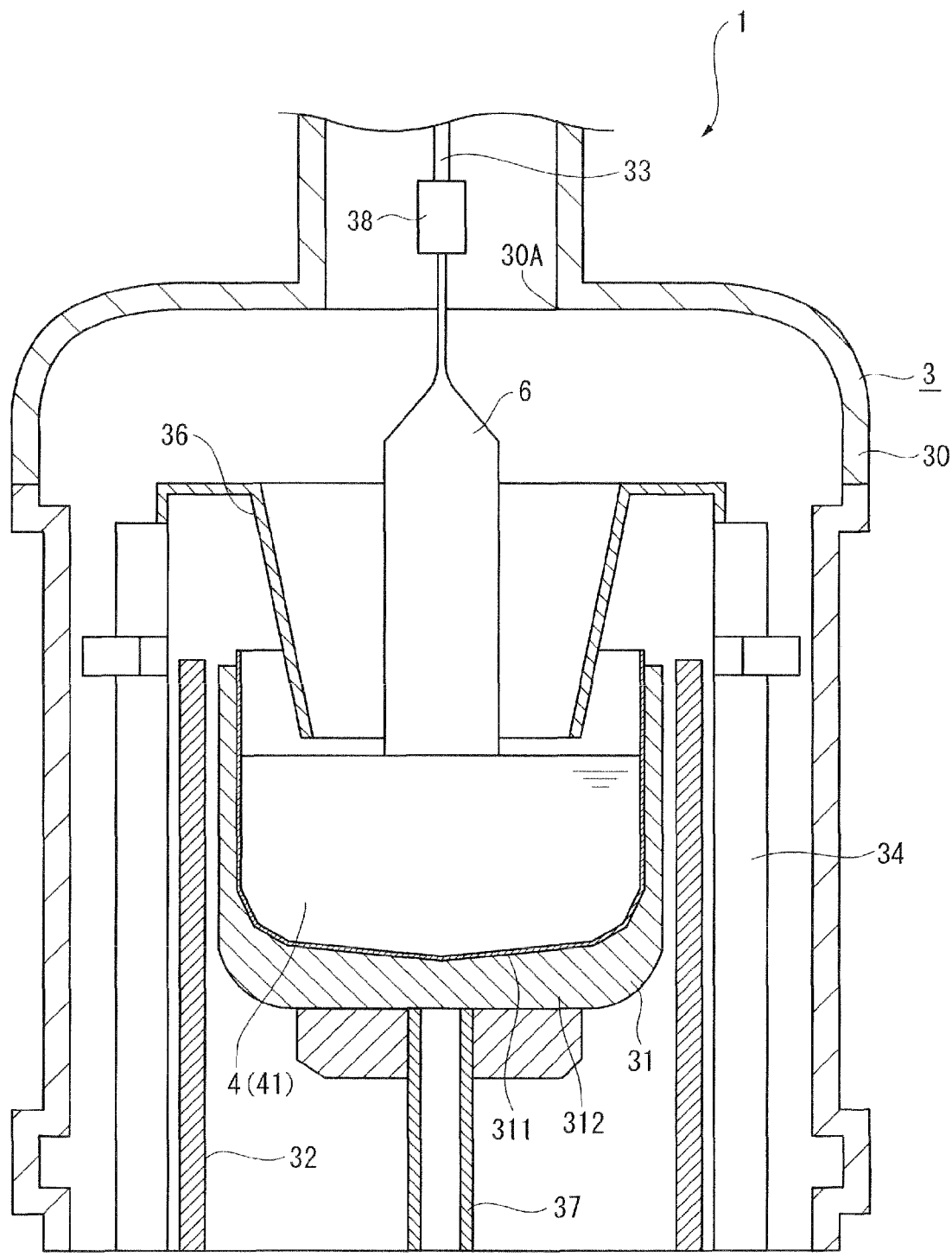
FIG. 3 schematically shows an arrangement of a monocrystal pulling-up apparatus according to an exemplary embodiment of the invention.

FIG. 3 schematically shows a monocrystal pulling-up apparatus for use in manufacturing a monocrystal according to this exemplary embodiment.

[Arrangement of Monocrystal Pulling-Up Apparatus]

First of all, an arrangement of a monocrystal pulling-up apparatus will be described.

As shown in FIG. 3, a monocrystal pulling-up apparatus 1 includes: an apparatus body 3 of the monocrystal pulling-up apparatus; a doping device (not shown); and a controller (not shown).

The apparatus body 3 includes a chamber 30, a crucible 31 disposed within the chamber 30, a heater 32 for heating the crucible 31 by radiating heat to the crucible 31, a pulling-up cable 33 (pulling-up portion), a heat insulating cylinder 34 and a shield 36.

Under a control performed by the controller, inactive gas such as argon gas is introduced into the chamber 30 from up to down at a predetermined gas flow volume through an intake 30A provided on an upper side of the chamber 30. Pressure within the chamber 30 (inner pressure) is controllable by the controller.

The crucible 31 is for melting polycrystal silicon, from which semiconductor wafers are made, so as to prepare the semiconductor melt 4 of silicon. The crucible 31 includes: a first crucible 311 made of quartz and shaped like a cylinder having a bottom; and a second crucible 312 made of graphite for accommodating the first crucible 311. The crucible 31 is supported by a support shaft 37 that is rotatable at a predetermined speed.

The heater 32 is disposed externally to the crucible 31 so as to heat the crucible 31 and melt silicon within the crucible 31.

The pulling-up cable 33 is connected at its first end to, for instance, a pulling-up driver (not shown) disposed above the crucible 31. On the other hand, the pulling-up cable 33 is attached at its second end to a seed holder 38 for supporting a seed crystal or to the doping device (not shown) as needed. The pulling-up cable 33 is rotatable by the driving of the pulling-up driver. By controlling the pulling-up driver with the controller, the pulling-up cable 33 is elevated at a predetermined pulling-up speed.

The heat insulating cylinder 34 is disposed so as to surround the crucible 31 and the heater 32.

The shield 36 is a heat-insulation shield for shielding radiation heat upwardly radiated from the heater 32. The shield 36 is disposed to cover the surface of the semiconductor melt 4. The shield 36 is shaped like a cone of which lower opening is smaller than its upper opening.

The doping device volatilizes the solid-state volatile dopant and dopes the volatile dopant to the semiconductor melt 4 in the crucible 31 (i.e., add the dopant to the melt) so as to prepare a dopant-added melt 41. Examples of the volatile dopant are red phosphorus, arsenic and antimony. The doping device may add the volatile dopant to the semiconductor melt 4 by soaking a lower end of a cylindrical portion into the semiconductor melt 4 or by spacing apart the lower end of the cylindrical portion from the semiconductor melt 4 and blowing the volatilized volatile dopant against the semiconductor melt 4.

The controller controls the gas flow volume, the inner pressure and the pulling-up speed of the pulling-up cable 33 within the chamber 30 as needed based on setting inputted by an operator, thereby performing a control during the manufacturing of a monocrystal 6.

[Manufacturing Method of Monocrystal]

Next, a method of manufacturing a monocrystal 6 by use of the monocrystal pulling-up apparatus 1 will be described.

Figure 4:
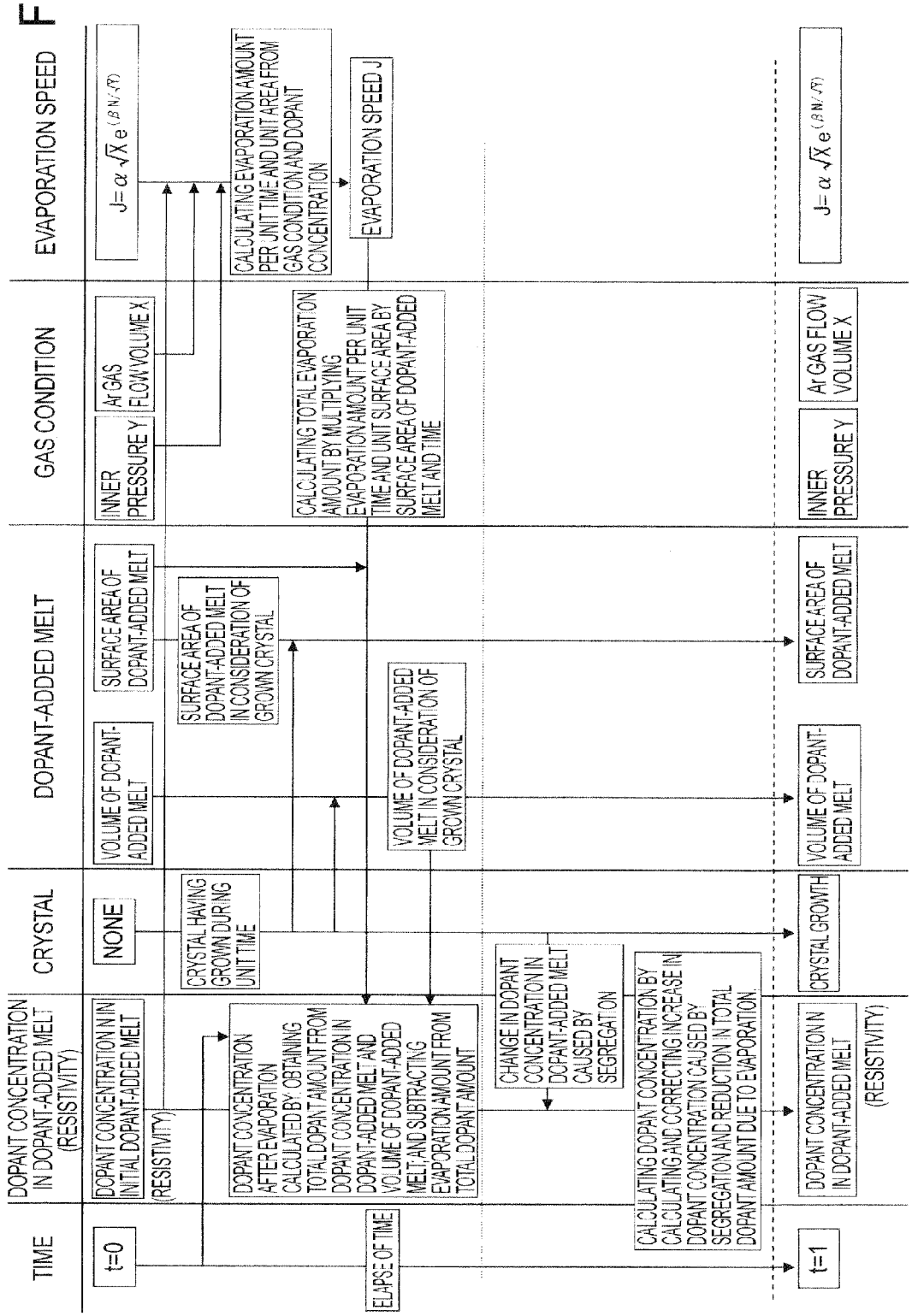
FIG. 4 is a flow chart showing an exemplary method of manufacturing a monocrystal according to the exemplary embodiment of the invention.

FIG. 4 is a flow chart showing an exemplary method of manufacturing a monocrystal 6.

First of all, an operator mounts the doping device onto the pulling-up cable 33 of the monocrystal pulling-up apparatus 1.

Then, controlled by the controller, the monocrystal pulling-up apparatus 1 sets the gas flow volume and the inner pressure within the chamber 30 respectively into predetermined states, and adds the volatile dopant to the semiconductor melt 4 for preparation of the dopant-added melt 41.

Subsequently, an operator detaches the doping device from the pulling-up cable 33 and then attaches the seed holder 38 holding a seed crystal onto the pulling-up cable 33.

Based on the setting inputted by an operator, the controller of the monocrystal pulling-up apparatus 1 pulls up the seed crystal at a predetermined pulling-up speed, and the monocrystal 6 is manufactured.

At the time of pulling up the seed crystal, as shown in FIG. 4, the evaporation speed J of the dopant is calculated from the following evaporation speed formula (3), in which: J represents an evaporation speed at which the volatile dopant is evaporated from the dopant-added melt 41 (i.e., evaporation amount of the dopant per unit time and unit evaporation area); N represents a concentration of the volatile dopant contained in the dopant-added melt 41 (i.e., in-melt dopant concentration); X represents a flow volume of inactive gas introduced into the chamber 30 (i.e., gas flow volume); Y represents a pressure within the chamber 30 (i.e., inner pressure); and α and β each represent a coefficient. Then, at a predetermined timing during the pulling-up, the evaporation speed J of the dopant is changed so as to make the dopant-added melt 41 capable of providing the monocrystal 6 with desirable resistivity, and the gas flow volume X and the inner pressure Y are controlled so as to set the cumulative evaporation amount of the dopant to become a predetermined amount.

$$J = \alpha \sqrt{X} e^{(\beta N/\sqrt{Y})} \quad (3)$$

At the time of performing a control based on the evaporation speed formula (3), a different control(s) is performed as needed, depending on length of the initiation standby period that runs from when the addition of the volatile dopant to the semiconductor melt 4 is terminated to when the pulling-up is initiated.

<1> Instances of Reference Standby State (i.e., when the Initiation Standby Period Stays within the Preset Reference Period)

In this instance, a control is performed so that the cumulative evaporation amount of the dopant becomes the predetermined reference amount. In other words, a control is performed so that the volatile dopant is evaporated as predetermined after the initiation of the pulling-up.

<2> Instances of Long Standby State (i.e., when the Initiation Standby Period is Longer than the Reference Period)

In this instance, a control is performed sometime after the control over the evaporation speed J of the dopant is initiated so that the cumulative evaporation amount of the dopant becomes the predetermined reference amount. In other words, a control is performed so that the evaporation of the volatile dopant is reduced after the initiation of the pulling-up.

<3> Instances of Short Standby State (i.e., when the Initiation Standby Period is Shorter than the Reference Period)

In this instance, a control is performed sometime after the control over the evaporation speed J of the dopant is initiated so that the cumulative evaporation amount of the dopant becomes the predetermined reference amount. In other words, a control is performed so that the evaporation of the volatile dopant is increased after the initiation of the pulling-up.

Further, based on the in-melt dopant concentration N as well as control over the gas flow volume X and the inner pressure Y, as shown in FIG. 4, the evaporation speed J of the dopant per unit time and unit area is calculated from the evaporation speed formula (3) so as to calculate the total evaporation amount based on the surface area of the dopant-added melt 41 and the time. Then, based on volume of the dopant-added melt 41 obtained in consideration of a crystal having grown during the unit time and on increase in the in-melt dopant concentration N entailed by segregation, the total amount of the dopant contained in the melt after elapse of the unit time is calculated. Subsequently, the in-melt dopant concentration N after elapse of the unit time is calculated by subtracting the total evaporation amount from the total dopant amount. The calculated in-melt dopant concentration N is convertible into resistivity after elapse of the unit time.

Subsequently, based on the calculated in-melt dopant concentration N after elapse of the unit time while the then gas flow volume X and the then inner pressure Y are controlled, the evaporation speed J of the dopant per unit time and unit area is calculated from the evaporation speed formula (3). Then, the above-described operations are conducted again.

The above-described control over the gas flow volume X and the inner pressure Y is then performed substantially consecutively during the pulling-up. For instance, the control is performed periodically. In one example, the control may be performed with short intervals when the pulling-up speed is high while the control may be performed with a long intervals when the pulling-up speed is low.

Effect(s) and Advantage(s) of Exemplary Embodiment(s)

As described above, the exemplary embodiment(s) can provide the following effect(s) and advantage(s).
(1) In manufacturing a monocrystal 6 by use of the monocrystal pulling-up apparatus 1, in order to make the dopant-added melt 41 capable of providing the monocrystal 6 with a desirable value of resistivity, the control over the cumulative evaporation amount of the dopant is initiated at the predetermined timing by changing the evaporation speed J of the dopant calculated from the above evaporation speed formula (3). On the other hand, the gas flow volume X and the inner pressure Y are also controlled so that the cumulative evaporation amount of the dopant becomes the predetermined amount.

By controlling the cumulative evaporation amount of the dopant calculated based on the evaporation speed formula (3) to become the predetermined amount, the evaporation of the volatile dopant can be reduced or increased as compared to the predetermined state. In addition, the evaporation speed formula (3) is derived in consideration of influence of segregation, a shape of the crucible corresponding to the evaporation area of the volatile dopant and influence of the pulling-up speed. Accordingly, in consideration of influence of segregation, the shape of the crucible 31 and influence of the pulling-up speed, the resistivity of the monocrystal 6 can be controlled to be the predetermined value, and the difference between the resistivity of the monocrystal 6 predicted based on the evaporation speed formula (3) and the actual resistivity can be made smaller as compared to a traditional arrangement.

In addition, since no volatile dopant is subsequently added in order to compensate a loss of the volatile dopant due to evaporation, an increase in workload on an operator and elongation of the manufacturing time can be prevented. Further, an increase in amorphous adhering to the inside of the chamber 30 due to the evaporation of the volatile dopant, a hamper in mono-crystallization of monocrystal 6 and an increase in load at the time of cleaning the inside of the chamber 30 can be prevented.

Therefore, the monocrystal 6 having desirable resistivity can be manufactured without reducing process capability.
(2) When the initiation standby period is longer than the reference period (i.e., in the long standby state), the gas flow volume X and the inner pressure Y are controlled such that the evaporation of the volatile dopant after the initiation of pulling-up is reduced.

Thus, even when the cumulative evaporation amount of the dopant up to the initiation of pulling-up is large as a consequence of the long standby state, the in-melt dopant concentration per predetermined time can be gradually approximated to the concentration exhibited in the reference standby state by reducing the evaporation of the volatile dopant after the initiation of pulling-up. Therefore, the monocrystal 6, except for its base end portion, can exhibit the resistivity that is substantially equal to that of a monocrystal manufactured in the reference standby state. Accordingly, mass-production of a monocrystal 6 having substantially equal resistivity except for its base end portion can be facilitated.
(3) When the initiation standby period is shorter than the reference period (i.e., in the short standby state), the gas flow volume X and the inner pressure Y are controlled such that the evaporation of the volatile dopant after the initiation of the pulling-up is increased.

Thus, even when the cumulative evaporation amount of the dopant up to the initiation of pulling-up is small as a consequence of the short standby state, the in-melt dopant concentration per predetermined time can be gradually approximated to the concentration exhibited in the reference standby state by increasing the evaporation of the volatile dopant after the initiation of pulling-up. Therefore, the monocrystal 6, except for its base end portion, can exhibit the resistivity that is substantially equal to that of a monocrystal manufactured in the reference standby state. Accordingly, mass-production of a monocrystal 6 having substantially equal resistivity except for its base end portion can be facilitated.
(4) The above-described control over the gas flow volume X and the inner pressure Y is performed substantially consecutively during the pulling-up.

Thus, the monocrystal 6 having a desirable resistivity profile all over in its longitudinal direction can be manufactured, thereby contributing to an increased yield rate as compared to a traditional arrangement.
(5) By changing the dopant-evaporation speed J so as to control the cumulative evaporation amount of the dopant, resistivity of the monocrystal 6 is controlled.

Accordingly, by using a simple method that only requires the dopant-evaporation speed J to be controlled, a monocrystal 6 having a desirable resistivity profile can be easily manufactured.

Other Exemplary Embodiment(s)

It should be understood that the invention is not limited to above-described exemplary embodiment(s) but may include a variety of improvements and design modifications as long as such improvements and modifications are compatible with a gist of the invention.

Specifically, neither a control during the long standby state nor a control during the short standby state may be performed.

Alternatively, either one of the control during the long standby state and the control during the short standby state may be performed.

The control over the gas flow volume X and/or the inner pressure Y may be performed only during an initial stage of pulling-up, only during a final stage of pulling-up or only during an intermediate stage of pulling-up.

Example 1

Relationship Between Resistivity of Monocrystal Manufactured Under Control Based on Evaporation Speed Formula and Resistivity Calculated from Evaporation Speed Formula Next, as an Example 1 of the invention, a relationship between the resistivity of the monocrystal manufactured under the control based on the evaporation speed formula (3) and the resistivity calculated from the evaporation speed formula (3) will be described.
(Experiment Method)

Figure 5:
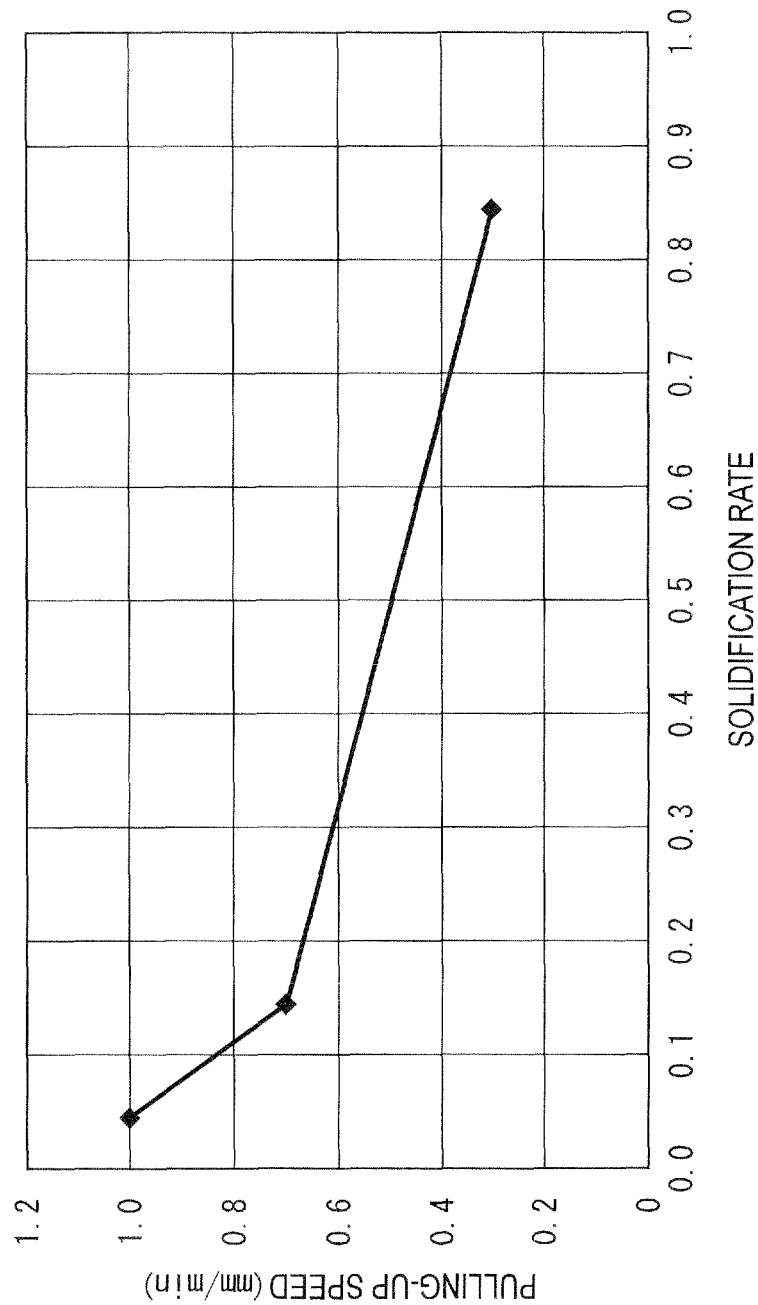
FIG. 5 is a graph showing a condition of pulling-up speed when a monocrystal was manufactured in accordance with a first example of the invention.

By use of a monocrystal pulling-up apparatus arranged similarly to the monocrystal pulling-up apparatus 1 in the above exemplary embodiment, a monocrystal was manufactured under conditions as shown in Table 3 and under pulling-up speed conditions as shown in FIG. 5.

Then, resistivity of the manufactured monocrystal in the pulling-up direction was measured to obtain the actually-measured profile.

TABLE 3

| Dopant | Arsenic |
|---|---|
| Inner pressure (Pa) | 59985 |
| Ar (argon) Gas Flow volume (L/min) | 150 |

Then, the values shown in Table 3 were respectively assigned to the in-melt dopant concentration N in the initial state, the gas flow volume X and the inner pressure Y in the evaporation speed formula (3) while values specific to the monocrystal pulling-up apparatus were respectively assigned to the coefficients α and β in the evaporation speed formula (3), and the evaporation speed J of the dopant per unit time was calculated. Further, the obtained evaporation speed J of the dopant was multiplied by the evaporation area of the volatile dopant and the unit time, so that the amount of the volatile dopant having been evaporated from the dopant-added melt per unit time was calculated. Subsequently, based on the obtained evaporation amount, the in-melt dopant concentration per unit time was calculated. Based on the calculated in-melt dopant concentration, the resistivity of the manufactured monocrystal in the pulling-up direction was calculated as the calculated profile.
(Experiment Results)

Figure 6:
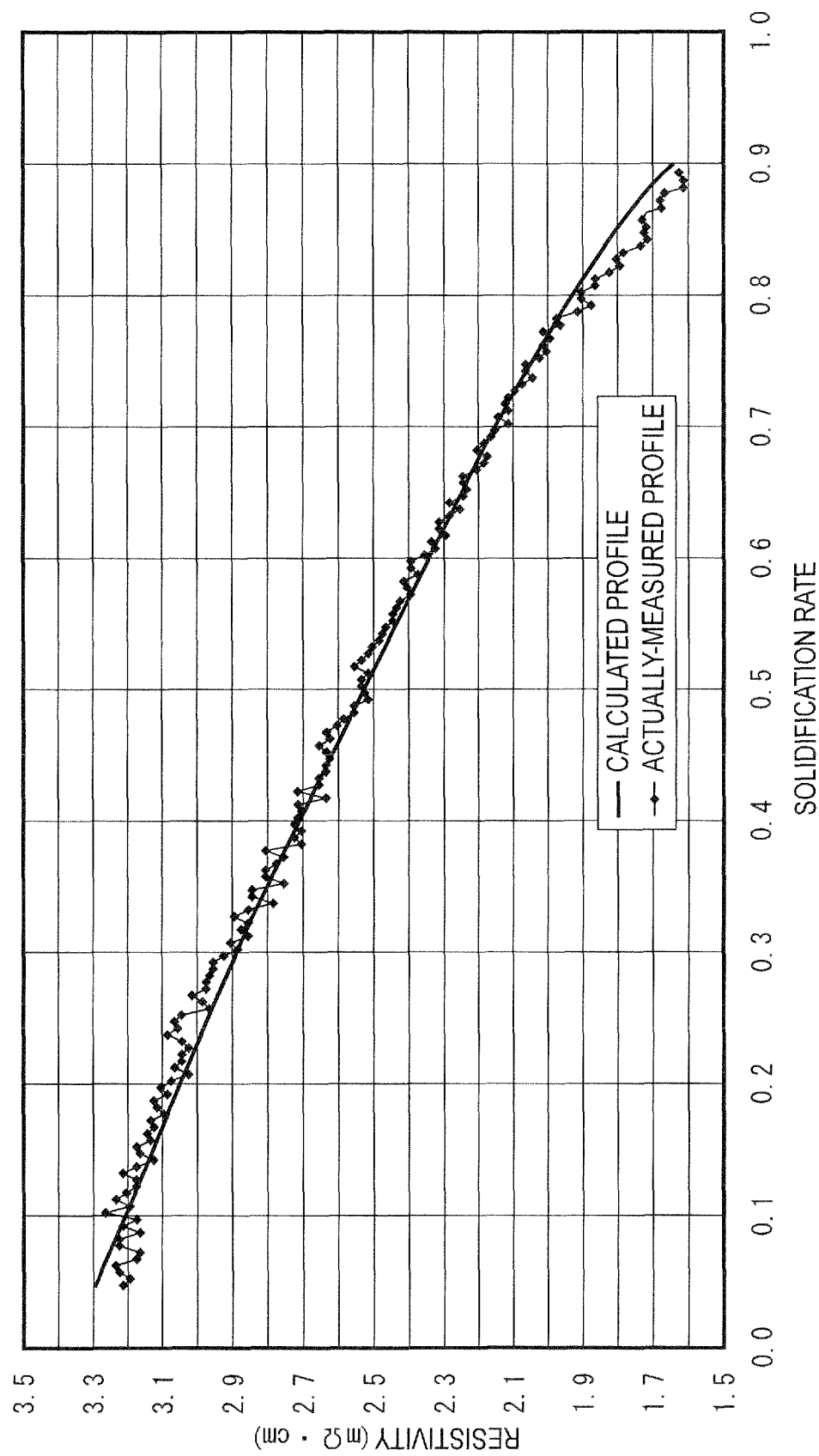
FIG. 6 is a graph showing a relationship between an actually-measured profile and a calculated profile in the first example.

As shown in FIG. 6, the actually-measured profile and the calculated profile have been found substantially equal to each other all over in the pulling-up direction of the monocrystal.

It has been observed from the above that the control based on the evaporation speed formula (3) could: control the resistivity of the monocrystal to be the predetermined value with influence of segregation, the shape of the crucible 31 and influence of the pulling-up speed being taken into account; and make the difference between the resistivity profile of the monocrystal predicted based on the evaporation speed formula (3) and the actual resistivity profile smaller as compared to a traditional arrangement.

Example 2

Relationship Between Conditions of Control Over Manufacturing of Monocrystal During Initiation Standby Period and Resistivity of Monocrystal Next, as an Example 2 of the invention, a relationship between conditions of the control over manufacturing of a monocrystal during the initiation standby period and the resistivity of the monocrystal will be described.
{Relationship Between Initiation Standby Period and Resistivity of Monocrystal}

First of all, the relationship between the initiation standby period and resistivity of a monocrystal was examined.

(Experiment Method)

Figure 7:
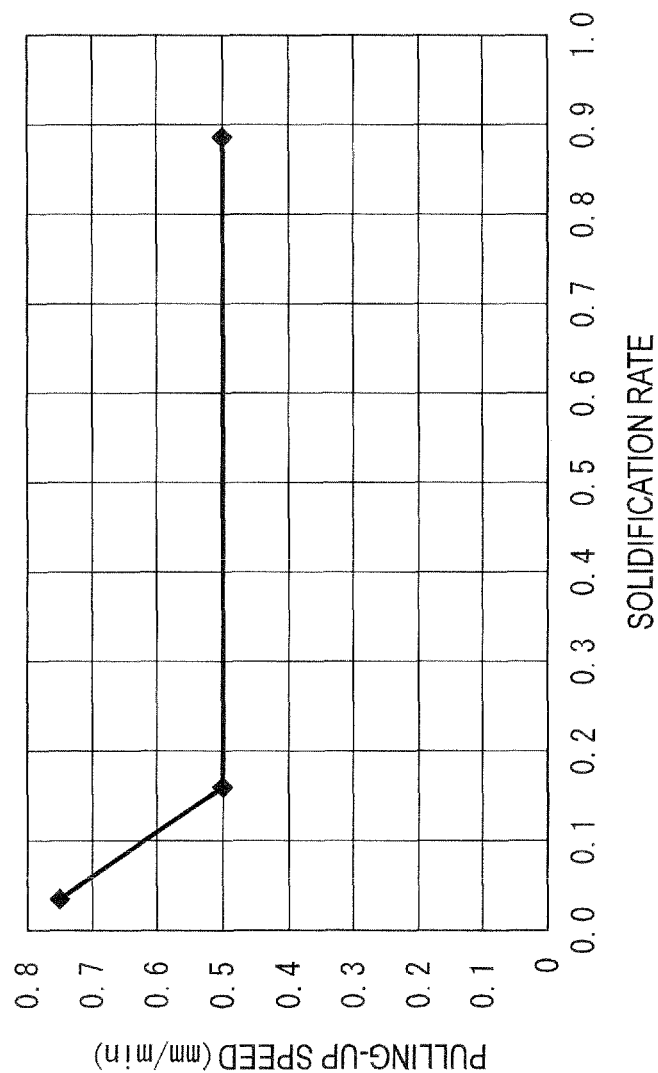
FIG. 7 is a graph showing a condition of pulling-up speed when comparative samples 1 and 2 and an operation sample were manufactured in accordance with a second example of the invention.

By use of a monocrystal pulling-up apparatus arranged similarly to the monocrystal pulling-up apparatus 1 in the above exemplary embodiment, a monocrystal was manufactured as a comparative sample 1 with the initiation standby period being set as the reference standby state. In addition, a monocrystal was manufactured as a comparative sample 2 with the initiation standby period being set longer than that of the comparative sample 1 (i.e., long standby state). The comparative samples 1 and 2 were manufactured under pulling-up speed conditions shown in FIG. 7 and under gas-flow rate conditions shown in FIG. 8.

Figure 8:
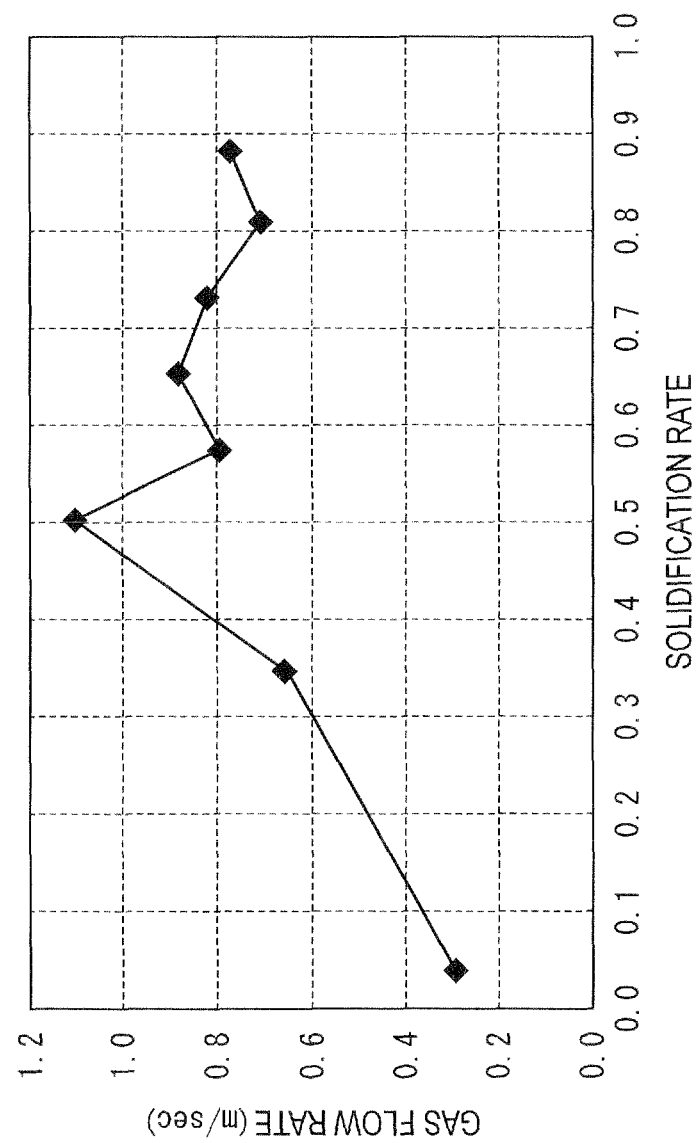
FIG. 8 is a graph showing a condition of gas flow rate when the comparative samples 1 and 2 were manufactured in the second example.

With Ar gas flow volume and the inner pressure being respectively controlled within a range of 70 L/min to 200 L/min and a range of 8000 Pa to 59985 Pa, the gas-flow rate shown in FIG. 8 was calculated by assigning the above values in the following formula (4). The following formula (4) will be hereinafter referred to as gas-flow rate calculation formula (4).

In the gas-flow rate calculation formula (4), R represents a flow rate (m/sec) of Ar gas at a position immediately above a free surface of the dopant-added melt, V represents a gas flow volume (L/min), D represents an inner diameter (m) of the shield, G represents a distance (m) between the lower end of the shield and the surface of the dopant-added melt, and P represents an inner pressure (Pa).

$$R = \frac{V \times 10^{-3}}{\pi \times D \times G} \times \frac{760 \times 133.3}{P} \times \frac{1}{60} \qquad (4)$$

(Experiment Results)

Figure 9:
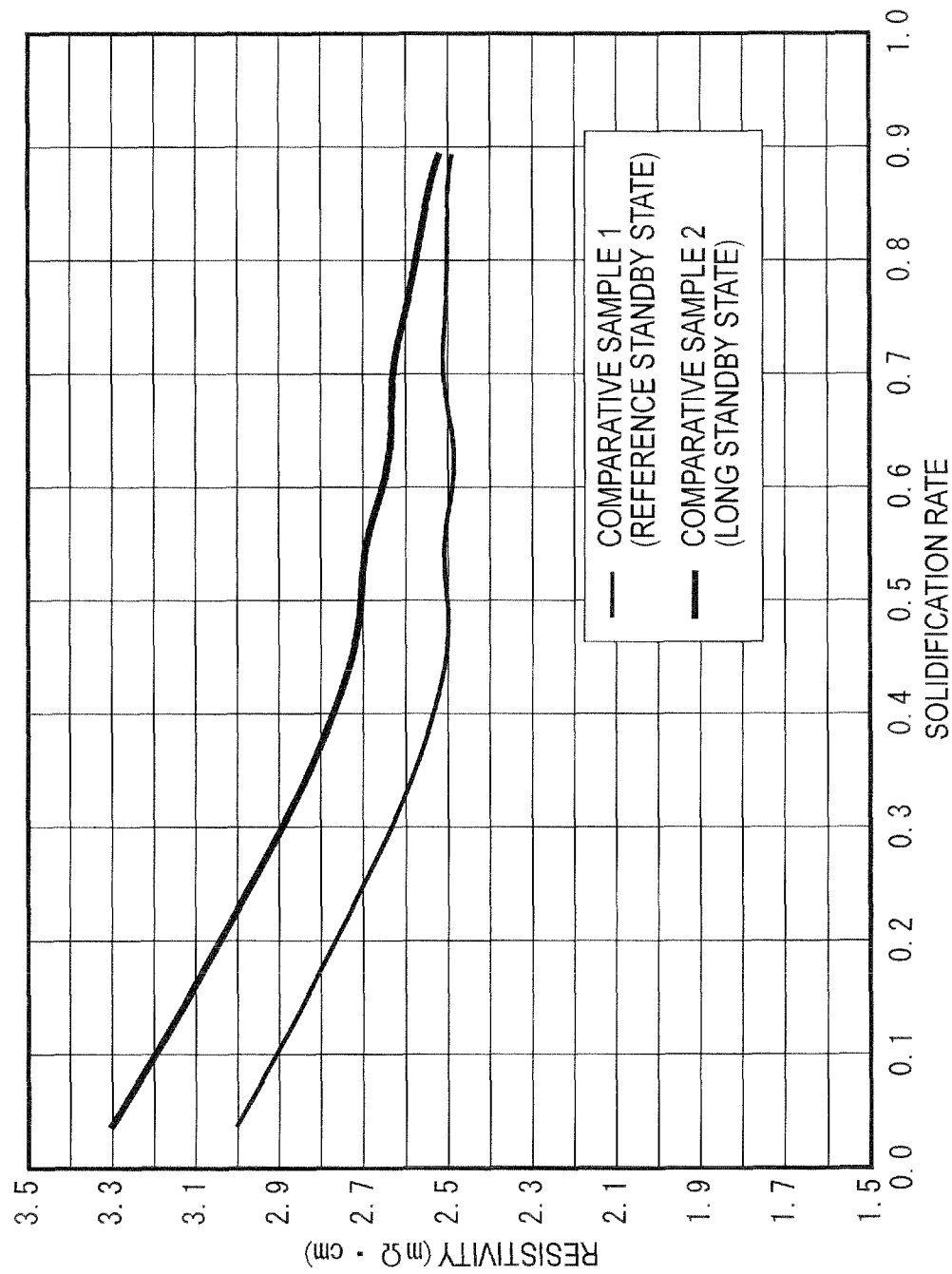
FIG. 9 is a graph showing a relationship of resistivity respectively exhibited by the comparative samples 1 and 2 in the second example.

As shown in FIG. 9, the comparative sample 2 is found to have exhibited higher resistivity in the pulling-up direction of the monocrystal than the comparative sample 1.

A presumable reason for the above finding may be that the amount of the volatile dopant having been evaporated until the initiation of pulling-up was larger in the long standby state than in the reference standby state, so that the in-melt dopant concentration at the time of the initiation of pulling up became low.
{Relationship Between Conditions of Control Over Manufacturing of Crystal and Resistivity of Monocrystal}

Next, the relationship between conditions of the control over manufacturing of a monocrystal and resistivity of a monocrystal was examined.
(Experiment Method)

Figure 10:
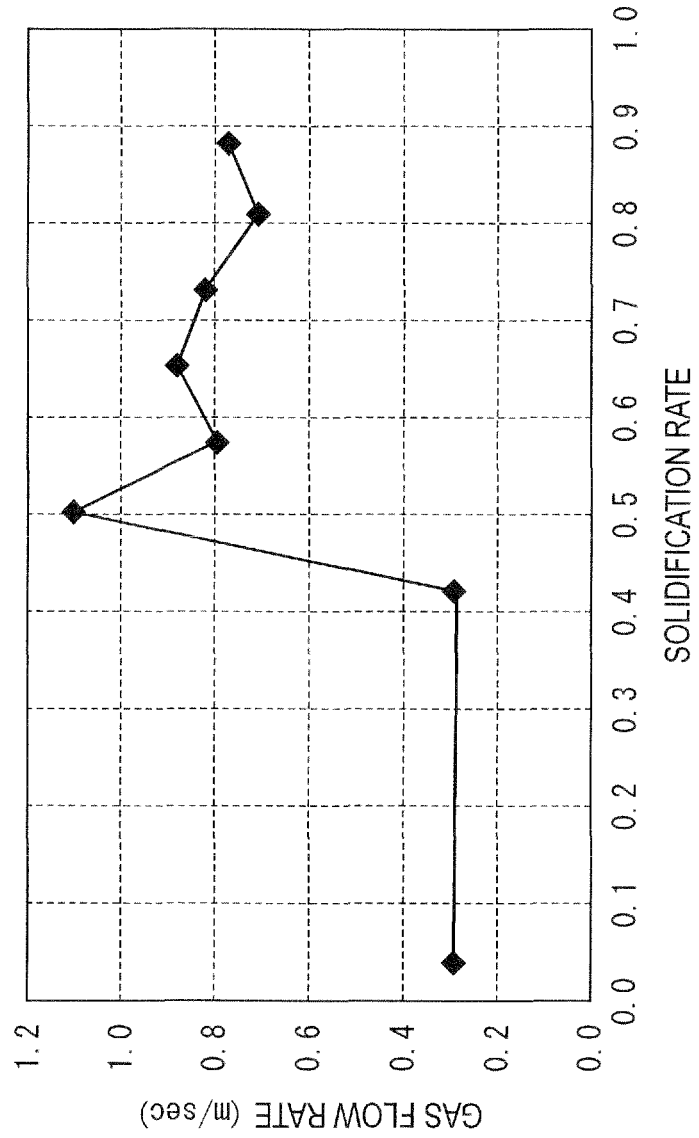
FIG. 10 is a graph showing a condition of gas flow rate when an operation sample was manufactured in the second example.

By use of a monocrystal pulling-up apparatus arranged similarly to the monocrystal pulling-up apparatus 1 in the above exemplary embodiment, a monocrystal was manufactured as an operation sample while the initiation standby period was set to be the long standby state and a control for reducing the evaporation of the volatile dopant after the initiation of pulling-up was in action (long-standby evaporation reducing control state). The operation sample was manufactured under the pulling-up speed conditions shown in FIG. 7 and under the gas-flow rate conditions obtained from the gas-flow rate calculation formula (4) as shown in FIG. 10. In other words, as control conditions for reducing the evaporation of the volatile dopant, the gas-flow rate was kept low until the solidification rate became approximately 0.42 in manufacturing the operation sample, in order to reduce the evaporation speed J of the dopant after the initiation of pulling-up, which was obtained from the evaporation speed formula (3), as compared to the comparative sample 2.

(Experiment Results)

Figure 11:
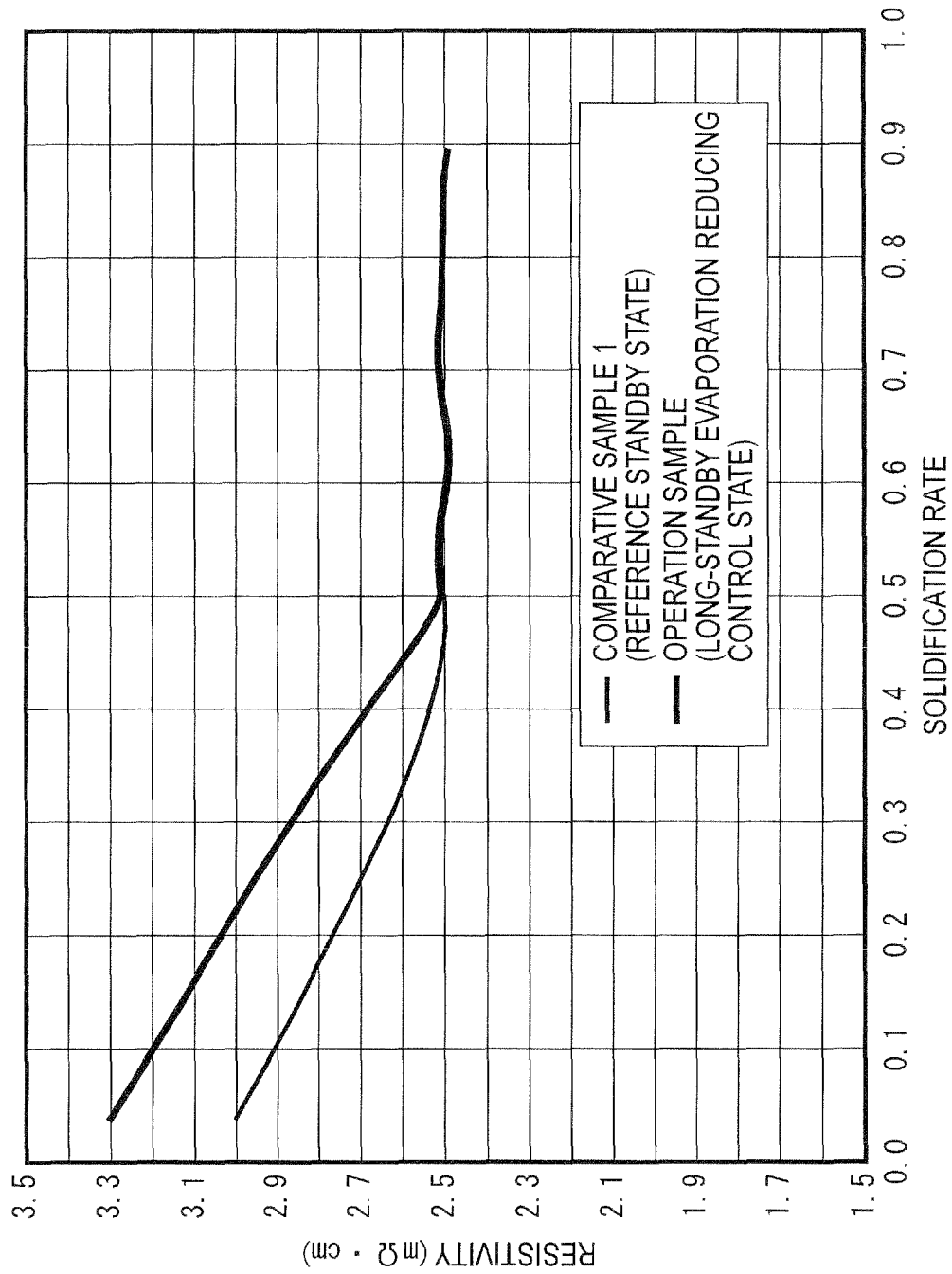
FIG. 11 is a graph showing a relationship of resistivity respectively exhibited by the comparative sample 1 and the operation sample in the second example.

As shown in FIG. 11, it has been found that the operation sample exhibited higher resistivity in the vicinity of the base end of the monocrystal (solidification rate of 0.0) than the comparative sample 1 while exhibiting resistivity substantially equal to the resistivity of the comparative sample 1 in a portion closer to its distal end (solidification rate of 1.0) relative to a position where the solidification rate was approximately 0.5.

A presumable reason for the above finding may be that, by performing such a control as to reduce the evaporation of the volatile dopant after the initiation of the pulling-up in the long standby state, the in-melt dopant concentration per predetermined time could be gradually approximated to the concentration exhibited in the reference standby state and made substantially equal thereto at the position where the solidification rate was approximately 0.5.

It has been observed from the above that, by performing such a control as to reduce the cumulative evaporation amount of the dopant after the initiation of the pulling-up, which is obtained based on the evaporation speed formula (3), even the monocrystal manufactured in the long standby state can exhibit resistivity substantially equal to the resistivity exhibited in the reference standby state except for its base end portion.

The invention claimed is:

1. A method of manufacturing a monocrystal, the method comprising:
   providing a monocrystal pulling-up apparatus including:
      a chamber;
      a crucible disposed within the chamber and adapted to accommodate a dopant-added melt prepared by adding a volatile dopant to a semiconductor melt, wherein the volatile dopant is red phosphorous; and
      a pulling-up portion for pulling up a seed crystal after the seed crystal is brought into contact with the dopant-added melt;
   calculating a dopant evaporation speed J of the volatile dopant at which the volatile dopant is evaporated from the dopant-added melt per a unit time and a unit area using a formula (1) as follows:

$$J = \alpha \sqrt{X} e^{(\beta N/\sqrt{Y})} \tag{1}$$

in which:
      N represents a concentration of the volatile dopant contained in the dopant-added melt;
      X represents a flow volume of inactive gas introduced into the chamber;
      Y represents a pressure in the chamber; and
      $\alpha$ and $\beta$ each represent a coefficient;
   calculating a cumulative evaporation amount of the volatile dopant at a predetermined timing of pulling up based on a product of the calculated dopant evaporation speed J, a cumulative time, and a surface area of the dopant-added melt; and
   controlling at least one of the flow volume X and the pressure Y so that the cumulative evaporation amount of the volatile dopant becomes a predetermined amount.

2. The method of manufacturing a monocrystal according to claim 1, wherein:
   when an initiation standby period is longer than a reference period, at least one of the flow volume X and the pressure Y is controlled to reduce the evaporation speed so that the cumulative evaporation amount of the volatile dopant becomes a reference amount, the initiation standby period running from when an addition of the volatile dopant to the semiconductor melt is terminated to when pulling-up is initiated.

3. The method of manufacturing a monocrystal according to claim 1, wherein:
   when an initiation standby period is shorter than a reference period, at least one of the flow volume X and the pressure Y is controlled to increase the evaporation speed so that the cumulative evaporation amount of the volatile dopant becomes a reference amount, the initiation standby period running from when an addition of the volatile dopant to the semiconductor melt is terminated to when pulling-up is initiated.

4. The method of manufacturing a monocrystal according to claim 1, wherein:
   at least one of the flow volume X and the pressure Y is controlled substantially consecutively during pulling-up so as to manufacture the monocrystal.

5. The method of manufacturing a monocrystal according to claim 1, wherein:
   resistivity of the monocrystal is controlled by controlling the cumulative evaporation amount of the volatile dopant to become the predetermined amount.

* * * * *